US008129239B2

(12) United States Patent
Jung

(10) Patent No.: US 8,129,239 B2
(45) Date of Patent: Mar. 6, 2012

(54) SEMICONDUCTOR DEVICE HAVING AN EXPANDED STORAGE NODE CONTACT AND METHOD FOR FABRICATING THE SAME

(75) Inventor: Tae O Jung, Seoul (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 0 days.

(21) Appl. No.: 12/963,092

(22) Filed: Dec. 8, 2010

(65) Prior Publication Data
US 2011/0076835 A1 Mar. 31, 2011

Related U.S. Application Data

(62) Division of application No. 12/345,923, filed on Dec. 30, 2008, now Pat. No. 7,872,313.

(30) Foreign Application Priority Data

Nov. 6, 2008 (KR) .................. 10-2008-0110123

(51) Int. Cl.
*H01L 21/8242* (2006.01)

(52) U.S. Cl. ......... 438/248; 438/243; 438/244; 257/374

(58) Field of Classification Search .................. 438/243, 438/244, 248; 257/374
See application file for complete search history.

(56) References Cited

U.S. PATENT DOCUMENTS

| 7,387,941 B2 | 6/2008 | Lee |
| 2006/0084224 A1 | 4/2006 | Watanabe et al. |
| 2007/0173005 A1 | 7/2007 | Lee |
| 2007/0173015 A1 | 7/2007 | Im |
| 2007/0269946 A1 | 11/2007 | Wang et al. |

FOREIGN PATENT DOCUMENTS

KR 1020080074342 A 8/2008

OTHER PUBLICATIONS

USPTO OA mailed Dec. 28, 2009 in connection with U.S. Appl. No. 12/345,923.
USPTO OA mailed Jun. 9, 2010 in connection with U.S. Appl. No. 12/345,923.
USPTO NOA mailed Sep. 22, 2010 in connection with U.S. Appl. No. 12/345,923.

*Primary Examiner* — Jarrett Stark
*Assistant Examiner* — John M Parker
(74) *Attorney, Agent, or Firm* — Ladas & Parry LLP

(57) ABSTRACT

A semiconductor device is disclosed that stably ensures an area of a storage node contact connected to a junction region in an active region of the semiconductor device and is thus able to improve the electrical properties of the semiconductor device and enhance a yield, and a method for fabricating the same. The semiconductor device includes a semiconductor substrate having an active region including a gate, a storage node contact region, and an isolation region that defines the active region. A passing gate and an isolation structure surrounding the passing gate are formed in the isolation region. A silicon epitaxial layer is selectively formed over an upper portion of the passing gate to expand the storage node contact region.

12 Claims, 8 Drawing Sheets

SEMICONDUCTOR DEVICE HAVING AN EXPANDED STORAGE NODE CONTACT AND METHOD FOR FABRICATING THE SAME

CROSS-REFERENCE TO RELATED APPLICATIONS

The present application claims priority to Korean patent application number 10-2008-0110123 filed on Nov. 6, 2008, which is incorporated herein by reference in its entirety.

BACKGROUND OF THE INVENTION

The present invention relates to a semiconductor device and a method for fabricating the same, and more particularly, to a semiconductor device that stably ensures an area of a storage node contact connected to a junction region in an active region of the semiconductor device and is thus able to improve the electrical properties of the semiconductor device and enhance a yield, and a method for fabricating the same.

The size of a semiconductor wafer has continually increased due to the high integration of a semiconductor device and cost reduction. In addition, the size of a cell transistor is continually miniaturized to increase the degree of integration of the semiconductor device.

The first step in achieving a higher degree of integration of a semiconductor device is the reduction of the critical dimension of a circuit pattern for the semiconductor device. It is also necessary to ensure stable contact between a lower pattern and an upper pattern of the semiconductor device. This reduces a contact resistance between the lower pattern and the upper pattern and allows for a highly reliable semiconductor device capable of operating at high speeds.

Meanwhile, when a design rule decreases according to the miniaturization of a semiconductor device, the area of a storage node contact region that connects to a capacitor, i.e., a data storage with a junction region of a lower semiconductor substrate, is also reduced.

The reduction of the storage node contact region increases a resistance against electric signal transfer and lowers a refresh property of the cell transistor due to the formation of an abnormal storage node contact. As a result, a yield is reduced and the operating speed of the semiconductor device is lowered.

SUMMARY OF THE INVENTION

Embodiments of the present invention are directed to a semiconductor device that stably ensures an area of a storage node contact connected to a junction region in an active region, and is thus able to improve electrical properties and enhance a yield and a method for fabricating the same.

In one embodiment of the present invention, a semiconductor device comprises a semiconductor substrate provided with an active region provided with a gate and a storage node contact region and an isolation region defining the active region and formed therein with a passing gate and an isolation structure surrounding the passing gate; and a silicon epitaxial layer selectively formed over an upper portion of the passing gate so that the storage node contact region is expanded.

The gate and the passing gate are of an integrated type and formed in a linear shape, the gate is formed within the active region in pairs, and the storage node contact region is disposed at an outside of the gate.

The passing gate is formed in the portion of the isolation region linearly extended from the gate.

The isolation structure is extended under the passing gate.

The portion of the isolation structure extended under the passing gate has a thickness of 50 Å to 200 Å.

The isolation structure includes a linear insulation layer provided over the side wall and bottom of the isolation region.

The linear insulation layer includes a stacked layer of an oxide layer and a nitride layer.

The passing gate has an upper surface of which height is lower than a surface of the active region.

The gate and the passing gate are provided an insulation layer on the uppermost portion thereof.

In another embodiment of the present invention, a method for fabricating a semiconductor device comprises the steps of forming an insulation for device isolation in an isolation region of a semiconductor device provided with an active region provided with a gate and a storage node contact region and the isolation region defining a passing gate region and the active region; forming an isolation structure having a recess by removing a portion of the insulation layer for device isolation corresponding to the passing gate region; forming a gate and a passing gate over the gate region and within the recess of the passing gate region, respectively; and selectively forming a silicon epitaxial layer over an upper portion of the passing gate so that the storage node contact region is expanded.

The gate and the passing gate are formed are of an integrated type and formed in a linear shape, the gate is formed within the active region in pairs, and the storage node contact region is disposed at an outside of the gate.

The passing gate region is formed in the portion of the isolation region linearly extended from the gate region.

The isolation structure is formed so that the insulation layer for device isolation is extended under the passing gate.

The portion of the isolation structure extended under the passing gate formed so as to be remained by a thickness of 50 Å to 200 Å.

The step of forming the insulation layer for device isolation includes the steps of forming a trench in the isolation region; and forming a linear insulation layer over the side wall and bottom of the trench.

The linear insulation layer is formed of a stacked layer of an oxide layer and a nitride layer.

The passing gate is formed so as to have an upper surface of which height is lower than a surface of the active region.

The step of forming the gate and the passing gate includes the steps of forming a conductive layer over the gate region and within the recesses of the passing gate region; forming an insulation layer over the conductive layer; forming a mask pattern that covers the gate region and the passing gate region over the insulation layer; forming the gate and the passing gate by etching the insulation layer and the conductive layer; and removing the mask pattern.

The step of forming the gate and the passing gate may further includes, after the step of forming the conductive layer, a step of etching back the conductive layer so that the height of the conductive layer in the passing gate region is reduced.

The step of forming the gate and the passing gate further includes, after the step of forming the insulation layer, a step of etching back the insulation layer so that the height of the insulation layer in the passing gate region is reduced.

The step of forming the silicon epitaxial layer includes the steps of: forming a mask pattern, which selectively exposes an upper portion of the passing gate adjacent to the storage node contact region, over the active region and the isolation region; forming the silicon epitaxial layer over the exposed upper portion of the passing gate so that the storage node contact region is expanded; and removing the mask pattern.

The mask pattern is formed of an oxide layer.

DESCRIPTION OF SPECIFIC EMBODIMENTS

Hereinafter, preferred embodiments of the present invention will be described in detail with reference to accompanying drawings.

Figure 1:
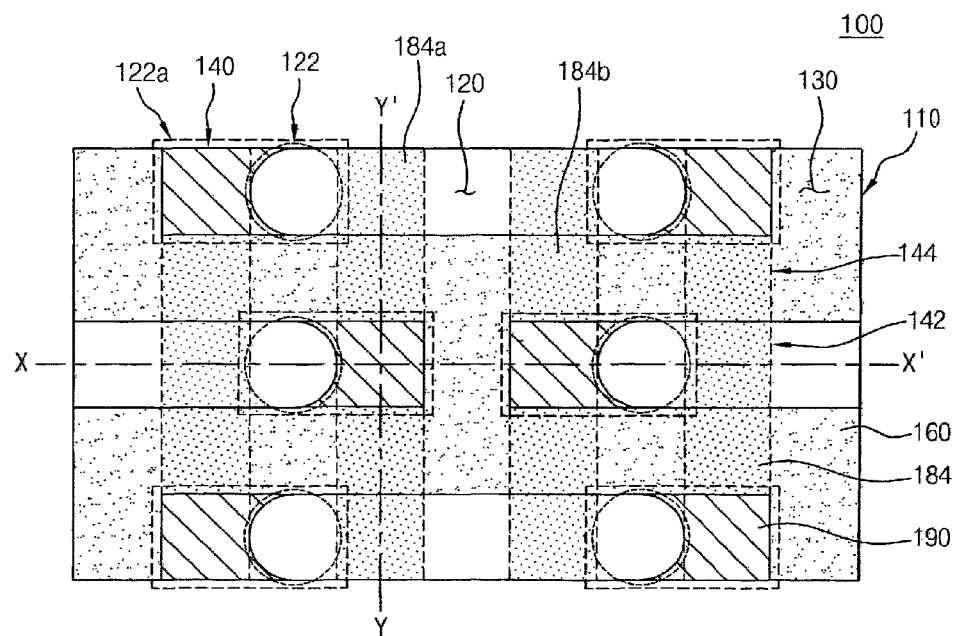
FIG. 1 is a plan view showing a semiconductor device in accordance with an embodiment of the present invention.
Figure 2:
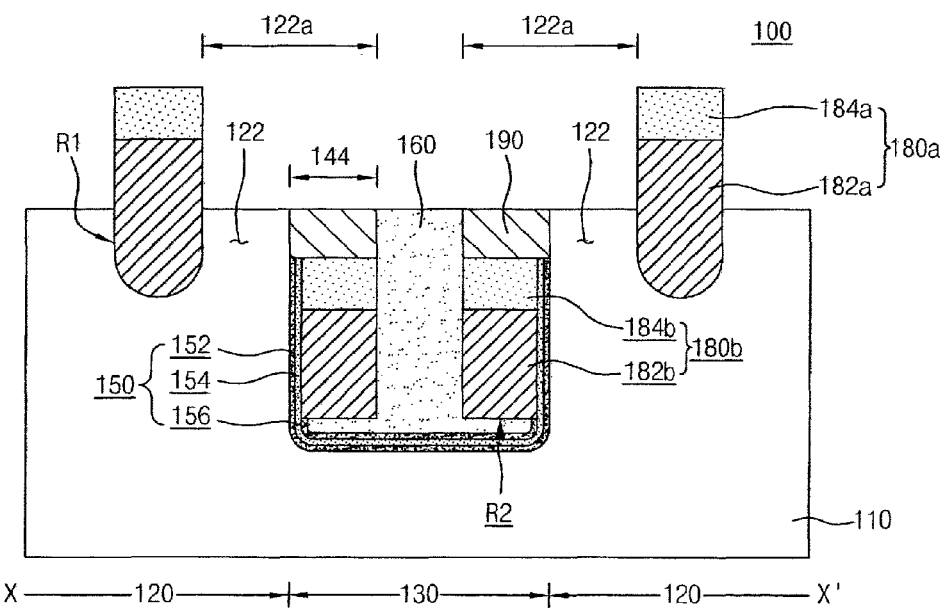
FIG. 2 is a longitudinal-sectional view taken along the line X-X' of FIG. 1.

FIG. 1 is a plan view showing a semiconductor device in accordance with an embodiment of the present invention; FIG. 2 is a longitudinal-sectional view taken along the line X-X' of FIG. 1; and FIG. 3 is cross-sectional view taken along the line Y-Y' of FIG. 1.

Figure 3:
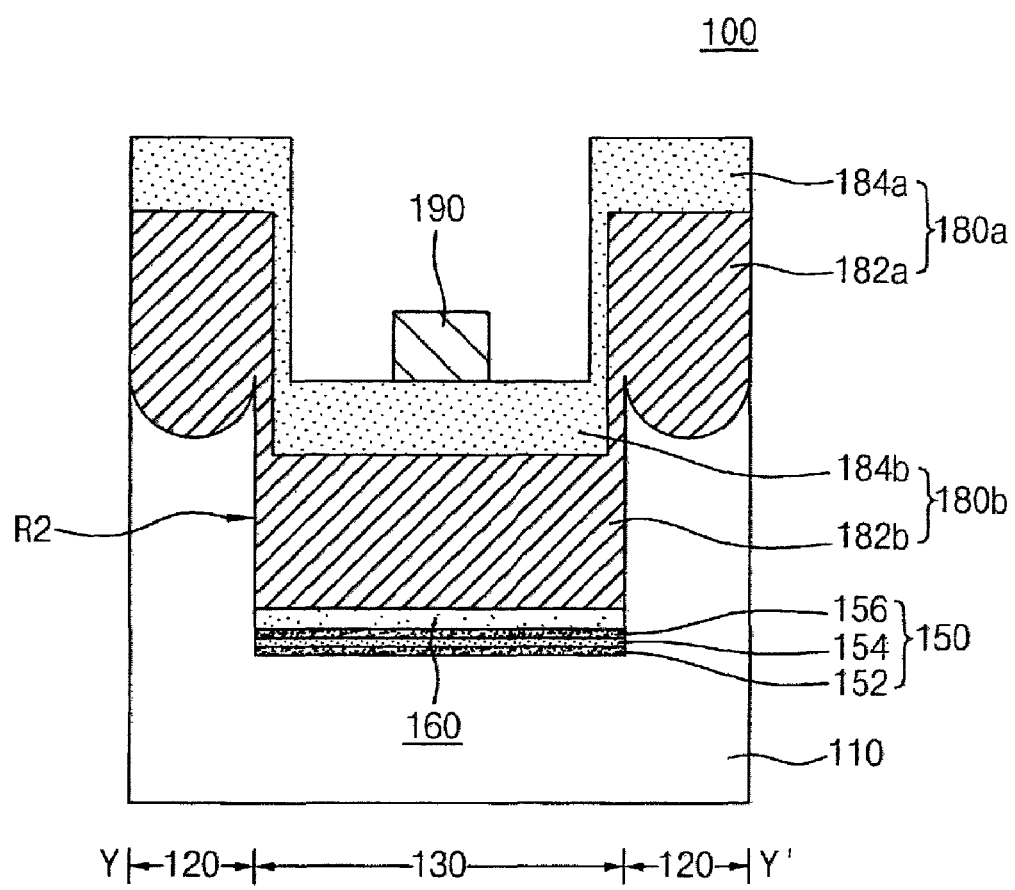
FIG. 3 is cross-sectional view taken along the line Y-Y' of FIG. 1.

Referring to FIGS. 1 through 3, a semiconductor device 100 in accordance with an embodiment of the present invention includes a silicon epitaxial layer 190 formed on an upper portion of a passing gate 180b of a semiconductor substrate 110. The semiconductor substrate 110 has an active region 120 including a storage node contact region 122 and an isolation region 130 having the passing gate 180b formed therein to expand the storage node contact region 122.

The semiconductor substrate 110 has a gate forming region 140. The gate forming region 140 is divided into a gate region 142 and a passing gate region 144 dependent on where the gate forming region 140 is positioned, i.e., in the active region 120 or the isolation region 130 respectively. A gate 180a and the passing gate 180b are formed in the gate region 142 and the passing gate region 144 respectively. The gate 180a and passing gate 180b are of an integrated type having a linear shape. The gate 180a and the passing gate 180b are formed as a pair within each active region 120 and isolation region 130.

The active region 120 has a storage node contact region 122, which is connected with a storage contact and formed with a junction region (not shown). The storage node contact region 122 is formed outside the gate region, i.e., the storage node contact region 122 is a portion of the active region 120 located between the isolation region 130 and the gate region 142 of the active region 120. The gate region 142 is formed with a first recess R1. The gate region 142 including the first recess R1, which is formed in the active region 120, is formed to include the gate 180a having a conductive layer 182a and an insulation layer 184a formed on the conductive layer 182a, or a hard mask layer formed of a nitride layer.

The isolation region 130 is formed to define the active region 120 and includes an isolation structure 160 formed of an insulation layer for device isolation. The isolation structure 160 includes a linear insulation layer 150 formed at an interface of the active region 120 and the isolation region 130. The linear insulation layer 150 is comprised of a stacked layer having an oxide layer and a nitride layer, and preferably, the linear insulation layer 150 includes a side wall oxide layer 152, a linear nitride layer 154, and a linear oxide layer 156.

A portion of the isolation structure 160 that corresponds to the passing gate region 144 includes a second recess R2. The passing gate 180b comprises a conductive layer 182b and an insulation layer 184b or a hard mask layer formed of a nitride layer formed within the second groove R2. The passing gate 180b is formed to a height such that an upper surface of the insulation layer 184b is formed below the surface of the active region 120. The isolation structure 160 is formed to surround the side wall of the passing gate 180b and also extends beneath the passing gate 180b in a thickness of 50 Å to 200 Å. The portion of the isolation structure 160 that is extended beneath the passing gate 180b is not extended beneath the passing gate 180b when the linear insulation layer 150 performs the electric insulation smoothly. The isolation structure 160 may be provided at the interface between the active region 120 and the isolation region 130 for electric insulation.

On the upper portion of the passing gate 180b provided in the isolation region 130, i.e., an upper portion of the insulation layer 184b, a silicon epitaxial layer 190 is selectively formed. The silicon epitaxial layer 190 expands the surface area of the storage node contact region 122 of the active region 120, i.e., the area of the storage node contact region 122 formed with the junction region (not shown). As a result, the semiconductor device 100 has an expanded storage node contact region 122a.

FIGS. 4A through 4K are views shown for illustrating the steps of a method for fabricating a semiconductor device in accordance with an embodiment of the present invention.

Figure 4A:
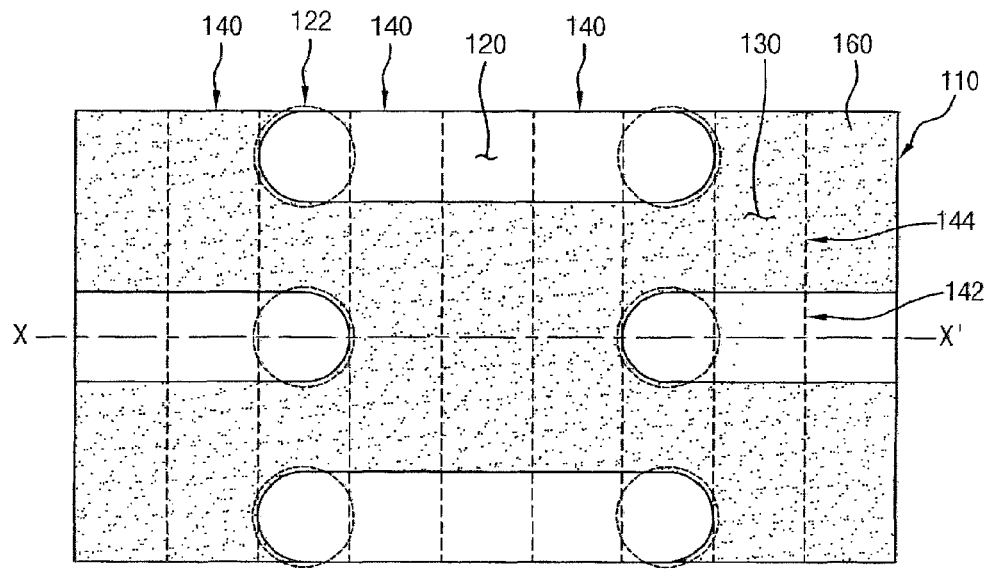
FIGS. 4A through 4K are views shown for illustrating the steps of a method for fabricating a semiconductor device in accordance with an embodiment of the present invention.
Figure 4B:
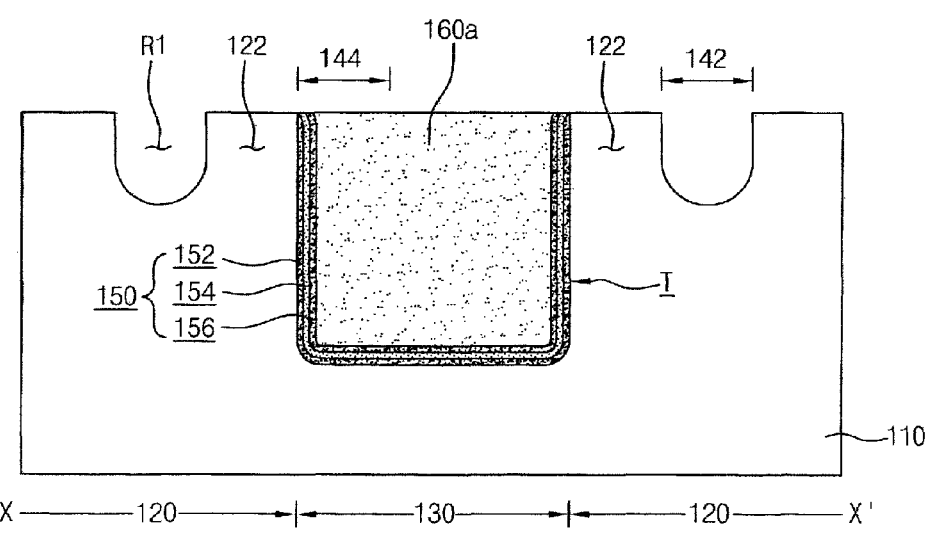

Referring to FIGS. 4A and 4B, the semiconductor substrate 110 includes the active region 120, which has a gate forming region 140 including the gate region 142 and the passing gate region 144. The gate region 142 and the passing gate region 144 are disposed as a pair and have an integrated type. A storage node contact region 122 is located outside the gate region 142. The isolation region 130 is also formed to define the active region 120. An etching process is performed on the semiconductor substrate 110 to form a trench T in the isolation region 130.

The linear insulation layer 150 comprises a stacked layer structure of an oxide layer and a nitride layer and is formed on the side walls and the bottom of the trench T in the isolation region 130, as shown in FIG. 4b. Preferably, the linear insulation layer 150 is formed such that the side wall oxide layer 152 is formed first over the interior surface of the trench T by performing an oxidation process in a high temperature furnace for curing a surface of the trench T damaged by the etching process. The linear nitride layer 154 and the linear oxide layer 156 are then sequentially formed over the side wall oxide layer 152 to cure any problems due to a thermal expansion coefficient, stress, and adhesive force that are related to the formation of the isolation structure of subsequent processes.

The insulation layer 160a for the device isolation is filled within the trench T having the linear insulation layer 150. A Chemical Mechanical Polishing (CMP) process is then performed to thereby define the active region.

A mask pattern (not shown) that exposes the gate forming region 140 is then formed over the semiconductor substrate 110. The gate region 142 of the active region 120 is then recessed according to an etching process to form the first recess R1 in the active region 120.

Figure 4C:
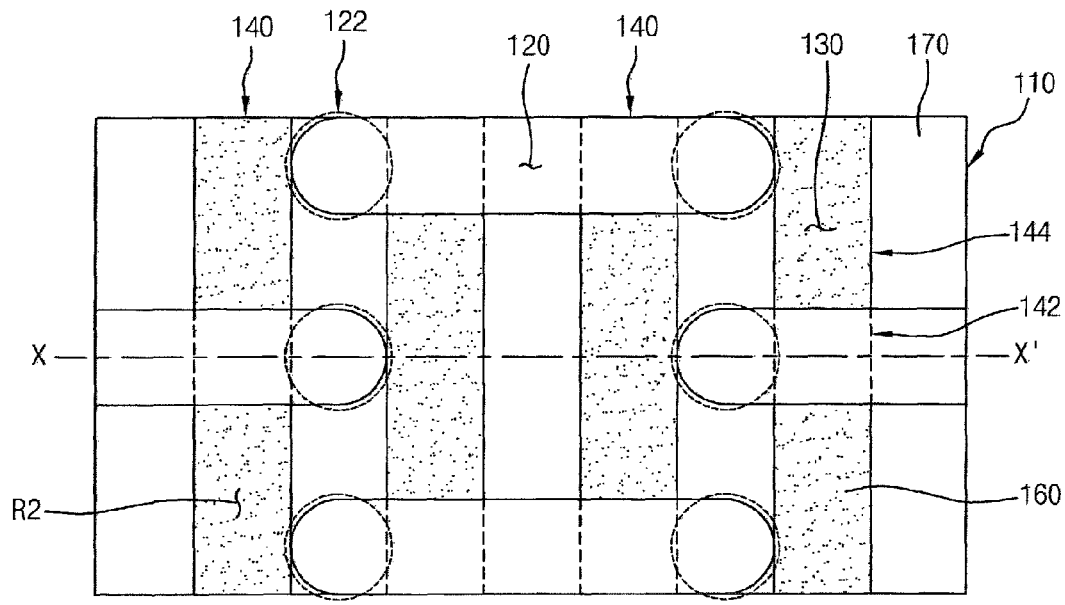
Figure 4D:
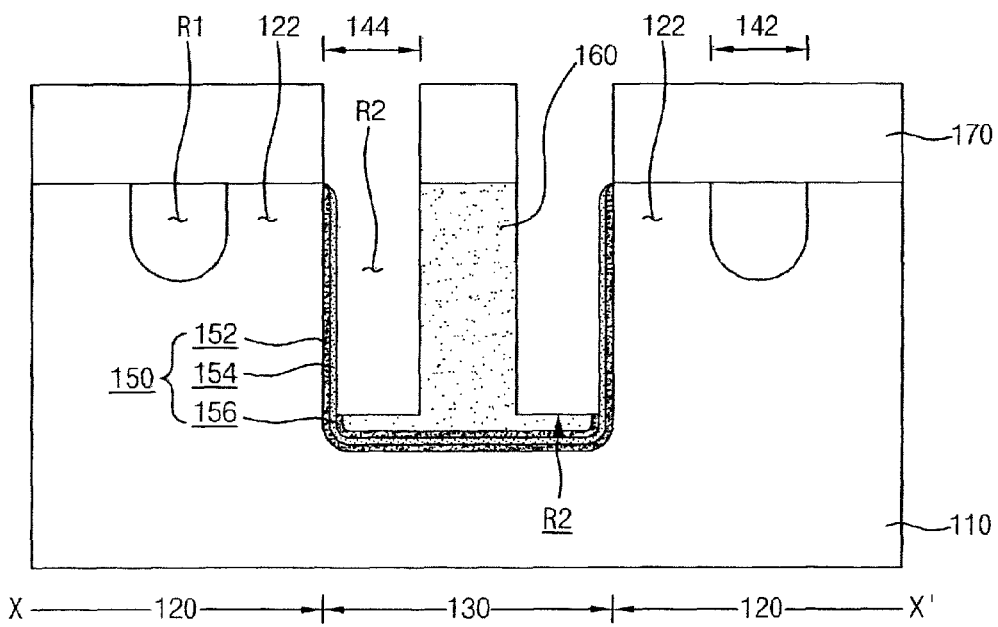

Referring to FIGS. 4C and 4D, a mask pattern 170 is formed over the semiconductor substrate 100. The mask pattern 170 exposes only the portion of the insulation layer corresponding to the passing gate region 144.

An etching process is performed on the exposed portion of the insulation layer for the device isolation to form an isolation to structure 160. A second recess R2 is correspondingly formed in the passing gate region 144. At this time, during the etching process, the linear oxide layer 156 previously formed over the side wall of the isolation structure 160, is removed together with an oxide layer that forms the isolation structure 160. The second recess R2 is formed so that the isolation structure 160 remains having a thickness of 50 Å to 200 Å over the isolation region 130 as the electric insulation.

Figure 4E:
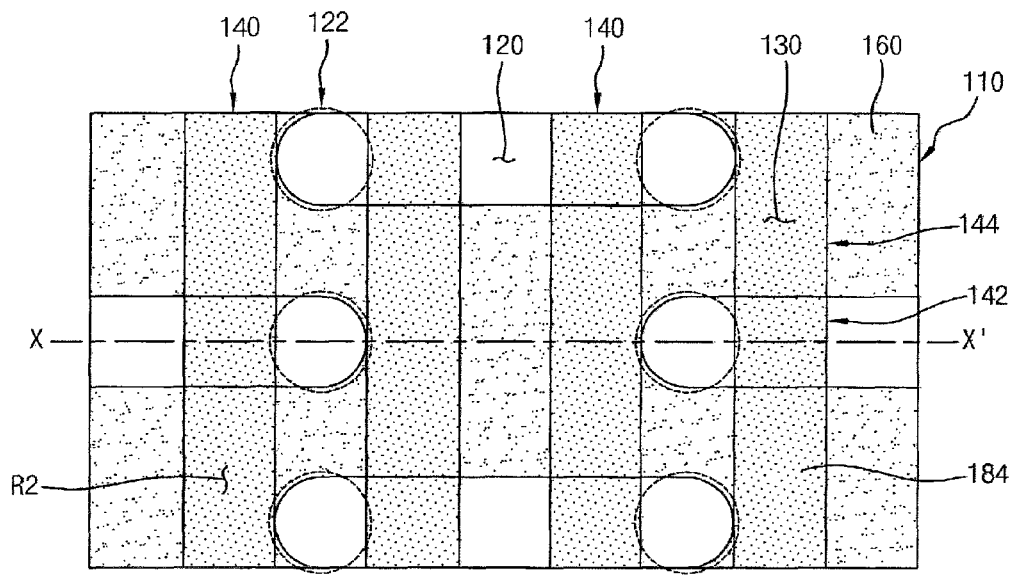
Figure 4F:
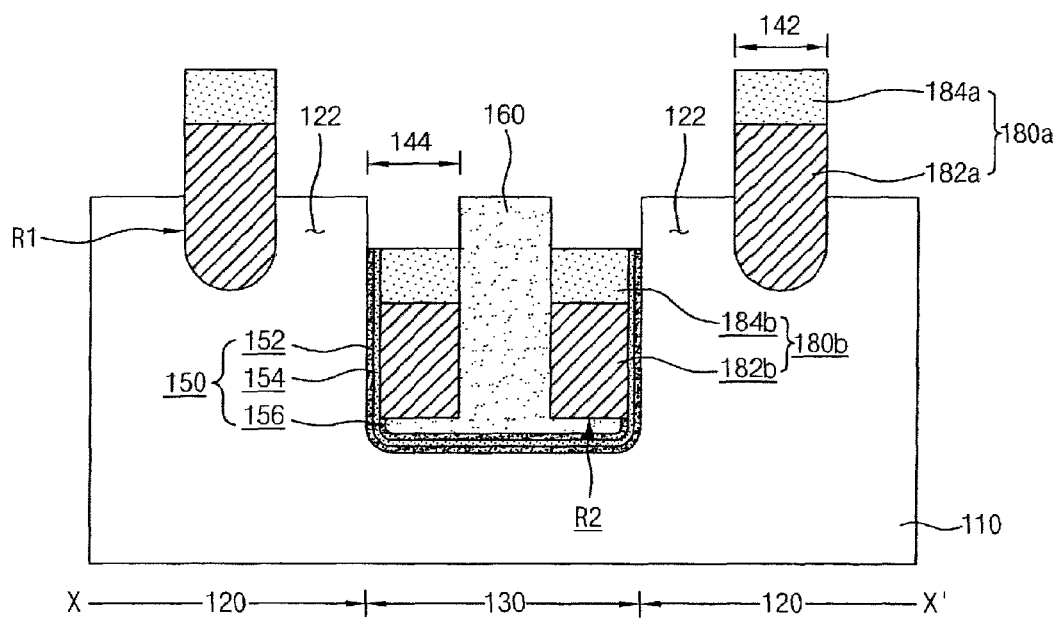

Referring to FIGS. 4E and 4F, after a gate insulation layer (not shown) is formed over the surface of the semiconductor substrate 110, a gate conductive layer and a gate hard mask layer, or an insulation layer formed of a nitride layer, are sequentially formed over the semiconductor substrate 110 to fill the first recess R1 and the second recess R2. A mask pattern (not shown) that covers the gate forming region 140 including the gate region 142 and the passing gate region 144 is subsequently formed over the insulation layer. After the formation of the mask pattern, an etching process is performed and the mask pattern is removed to form the gate 180a and the passing gate 180b respectively. The etching process etches the conductive layer 182a, 182b and the insulation layer 184a, 184b to form the gate 180a within the gate region 142 of the active region 120 and the passing gate 180b within the passing gate region 144 of the isolation region 130.

The passing gate 180b within the second recess R2 is formed to have a height such than an upper surface of the insulation layer 184b is formed below the surface of the active region 120. Where the conductive layer 182b is filled in the second recess R2 to a height greater than the required height when forming the conductive layer 182b is formed in the second recess due to the narrow width of the second recess R2, an etch back process may be performed to reduce the height of the conductive layer 182b to the required height. Alternatively, where the height of the conductive layer 182b is too high, it is also possible to reduce the height of the conductive layer 182b by performing an etching process after forming a mask pattern that exposes only the portion of the conductive layer 182b corresponding to the second recess R2. When forming the insulation layer 184b in the second recess R2, it is also possible to reduce the height of the insulation layer 184b using an etch back process or an etching process using a mask pattern similar to the process for reducing the height of the conductive layer 182b.

The linear insulation layer 150, which is formed in the trench T of the isolation region 130, located above the upper portion of the passing gate 180b is removed when patterning for the formation of the passing gate 180b is performed. As a result, the silicon on the side wall portion of the active region 120 above the passing gate 180b provided in the second recess R2 is exposed.

Figure 4G:
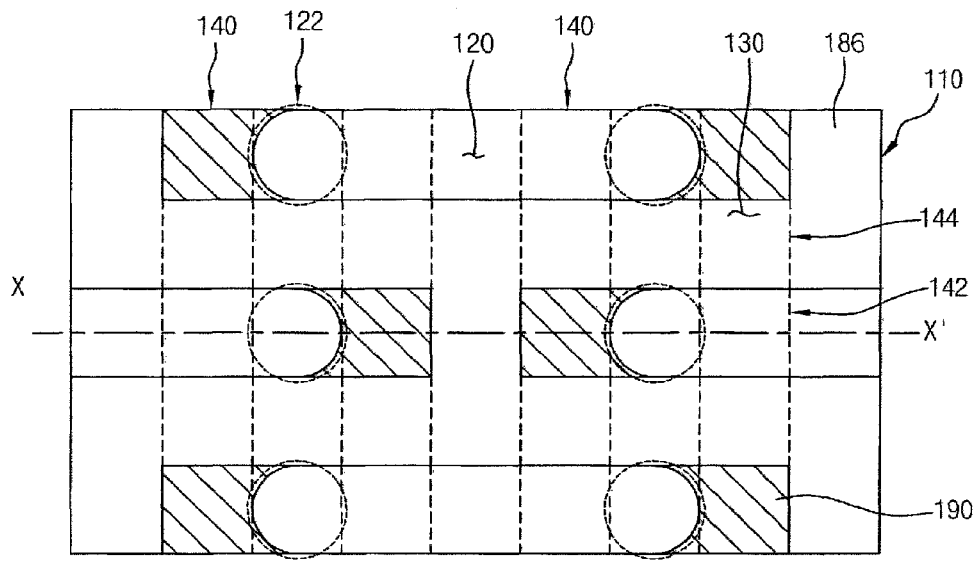
Figure 4H:
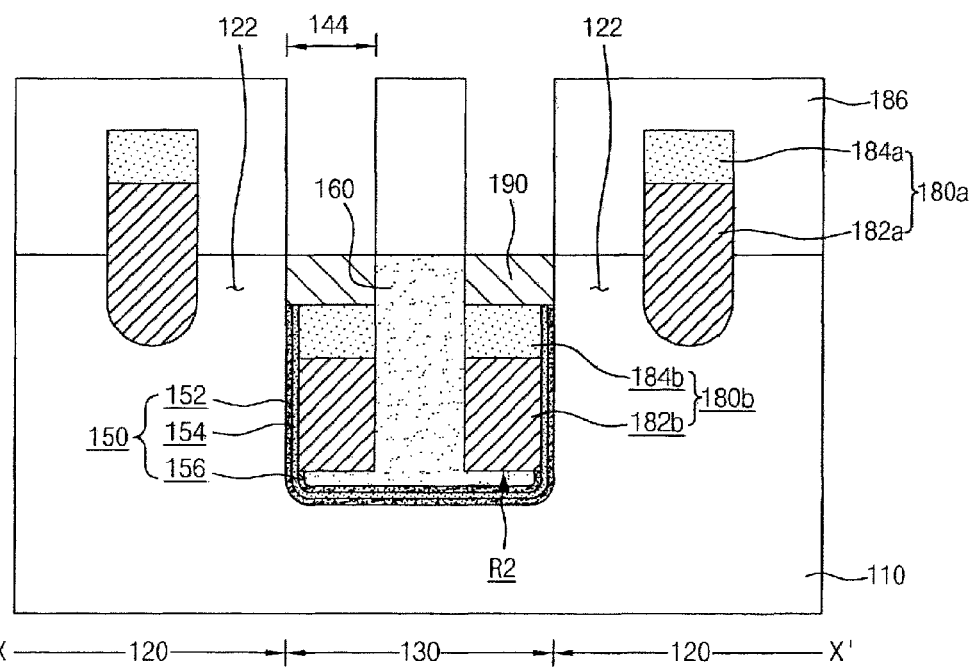

Referring to FIGS. 4G and 4H, a mask pattern 186 formed to of an oxide layer is formed over the active region 120 and the isolation region 130 of the semiconductor substrate 110 to selectively expose an upper portion of the passing gate 180b adjacent to the storage node contact region 122.

A Silicon Epitaxial Growth (SEG) process is performed over the side wall portion of the exposed active region 120, i.e., the upper portion of the active region 120 above the passing gate 180b, to form a silicon epitaxial layer 190 so that the exposed storage node contact region 122 is expanded.

Figure 4I:
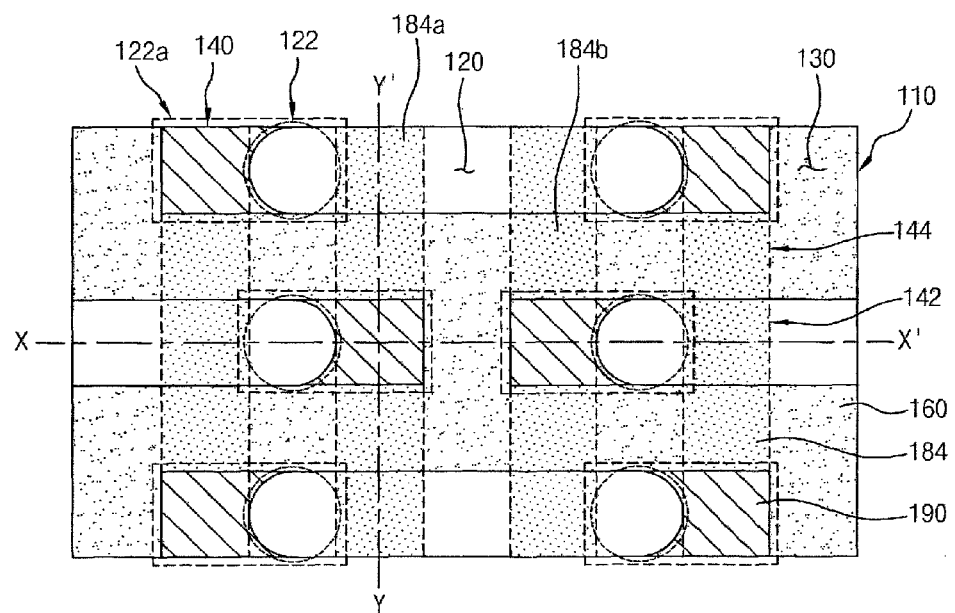
Figure 4J:
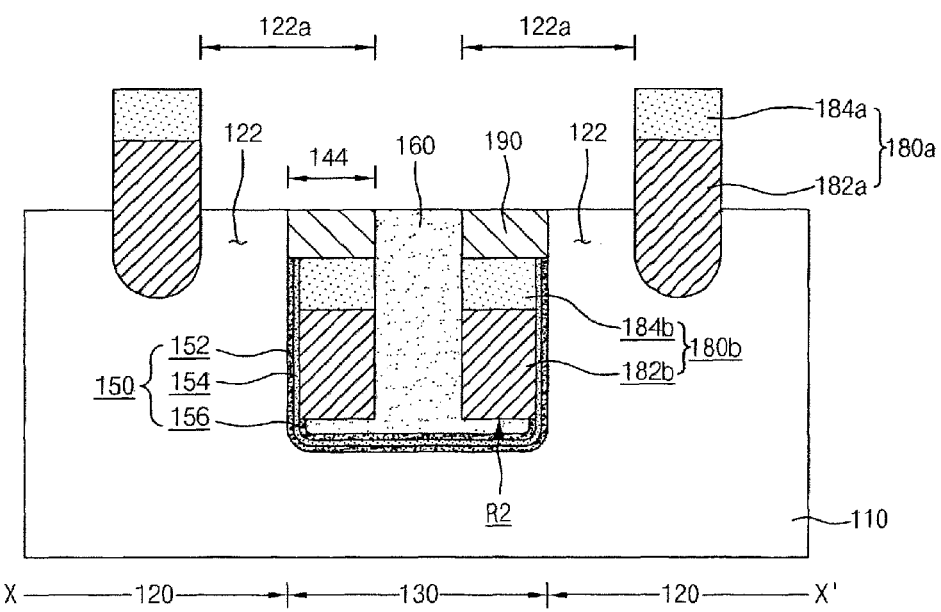
Figure 4K:
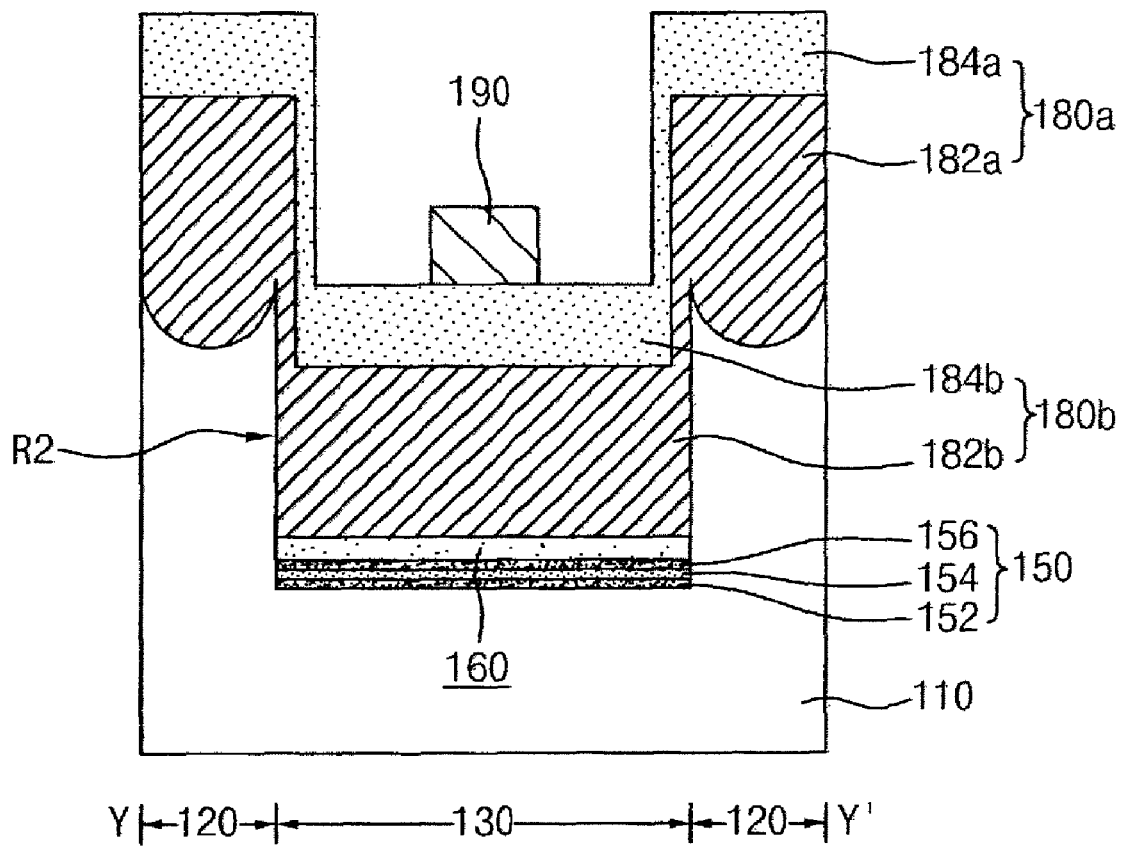

Referring to FIGS. 4I and 4K, the mask pattern formed of the oxide layer is removed to complete the fabrication of the semiconductor device having the expanded storage node contact 122a in accordance with an embodiment of the present invention.

As is apparent from the above description, according to the present invention, the passing gate is formed within the isolation region to be surrounded by the isolation structure, and the silicon epitaxial layer is selectively formed over the upper portion of the passing gate by a silicon epitaxial process. Therefore, the area of the storage node contact region provided outside the gate in the active region is expanded. Accordingly, although the size of the semiconductor device is reduced, it is possible to stably increase the junction area of the storage node contact region provided in the active region. As a result, according to the present invention, it is possible to improve an operation resistance of the semiconductor to device and improve a refresh characteristic.

Although specific embodiments of the present invention have been described for illustrative purposes, those skilled in the art will appreciate that various modifications, additions and substitutions are possible, without departing from the scope and the spirit of the invention as disclosed in the accompanying claims.

What is claimed is:

1. A method for fabricating a semiconductor device, comprising the steps of:
    forming an insulation layer for device isolation in an isolation region of a semiconductor device, the semiconductor device having an active region including a gate region and a storage node contact region, and wherein the isolation region defines a passing gate region and the active region;
    forming an isolation structure in the isolation region;
    forming a recess in the isolation structure by removing a portion of the insulation layer for device isolation corresponding to the passing gate region;
    forming a gate and a passing gate in the gate region and within the recess of the passing gate region, respectively; and
    selectively forming a silicon epitaxial layer on an upper portion of the passing gate adjacent to the storage node contact region to expand the storage node contact region.

2. The method according to claim 1, wherein the passing gate region is formed in a portion of the isolation region directly parallel to the gate region.

3. The method according to claim 1, wherein the isolation structure is formed such that a portion of the insulation layer for device isolation is extended below the passing gate.

4. The method according to claim 3, wherein the portion of the isolation structure extended below the passing gate is formed to have a thickness in the range of 50Å to 200Å.

5. The method according to claim 1, wherein the step of forming the insulation layer for device isolation includes the steps of:
    forming a trench in the isolation region; and
    forming a linear insulation layer over a bottom and side walls of the trench formed in the isolation region.

6. The method according to claim 5, wherein the linear insulation layer is formed of a stacked layer comprising an oxide layer and a nitride layer.

7. The method according to claim 1, wherein the passing gate is formed to a height such that an upper surface of the passing gate is below an upper surface of the active region.

8. The method according to claim 1, wherein the step of forming the gate and the passing gate includes the steps of:
    forming a conductive layer over the gate region and within the recess of the passing gate region;
    forming an insulation layer over the conductive layer formed over the gate region and within the recess of the passing gate region;
    forming a mask pattern over the insulation layer that covers the gate region and the passing gate region;
    forming the gate and the passing gate by etching the insulation layer and the conductive layer not covered by the mask pattern; and
    removing the mask pattern.

9. The method according to claim 8, wherein the step of forming the gate and the passing gate further includes, after the step of forming the conductive layer, a step of etching back the conductive layer to reduce a height of the conductive layer in the passing gate region.

10. The method according to claim 8, wherein the step of forming the gate and the passing gate further includes, after the step of forming the insulation layer, a step of etching back the insulation layer to reduce a height of the insulation layer in the passing gate region.

11. The method according to claim 1, wherein the step of selectively forming the silicon epitaxial layer includes the steps of:

forming a mask pattern over the active region and the isolation region that selectively exposes the upper portion of the passing gate adjacent to the storage node contact region;

performing growth process of the silicon epitaxial layer over the exposed upper portion of the passing gate; and removing the mask pattern.

12. The method according to claim 11, wherein the mask pattern is formed of an oxide layer.

* * * * *